(12) United States Patent
Mäkeläinen et al.

(10) Patent No.: US 9,983,740 B2
(45) Date of Patent: May 29, 2018

(54) ELECTROMAGNETIC SHIELDING

(71) Applicant: Nokia Technologies Oy, Espoo (FI)

(72) Inventors: Esa Juhani Mäkeläinen, Helsinki (FI); Janne Edvin Lesonen, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 139 days.

(21) Appl. No.: 14/580,907

(22) Filed: Dec. 23, 2014

(65) Prior Publication Data

US 2015/0189799 A1 Jul. 2, 2015

(30) Foreign Application Priority Data

Jan. 2, 2014 (GB) ..................... 1400019

(51) Int. Cl.
*G06F 3/046* (2006.01)
*G06F 3/0354* (2013.01)
*H05K 9/00* (2006.01)
*H05K 1/02* (2006.01)
*H01L 25/10* (2006.01)
*H01P 3/00* (2006.01)
*H01J 11/12* (2012.01)
*H01J 11/18* (2012.01)
*G06F 3/044* (2006.01)

(52) U.S. Cl.
CPC ........... *G06F 3/044* (2013.01); *H05K 9/0096* (2013.01); *G06F 2203/04107* (2013.01)

(58) Field of Classification Search
CPC ............... G06F 3/0412; G06F 3/03545; G02F 1/133308; H01J 11/12; H05K 1/0253
USPC ......................... 345/1.3, 174, 179; 315/169.1
See application file for complete search history.

(56) References Cited

U.S. PATENT DOCUMENTS

| 6,359,390 | B1 * | 3/2002 | Nagai ............... G02F 1/133308 315/169.1 |
| 8,487,898 | B2 | 7/2013 | Hotelling |
| 2004/0214496 | A1 * | 10/2004 | Yang .................... H05K 9/0086 442/301 |
| 2008/0303440 | A1 * | 12/2008 | Kawanami ............... H01J 11/12 313/584 |

(Continued)

FOREIGN PATENT DOCUMENTS

| CN | 202649985 U | 1/2013 |
| CN | 203217544 U | 9/2013 |

(Continued)

OTHER PUBLICATIONS

Search Report received for corresponding United Kingdom Patent Application No. 1400019.4, dated Jul. 4, 2014, 3 pages.

*Primary Examiner* — Jin Li
(74) *Attorney, Agent, or Firm* — Harrington & Smith

(57) ABSTRACT

An apparatus and a method of manufacturing the apparatus is provided. The apparatus comprises: a first electromagnetic shielding layer; a second electromagnetic shielding layer; at least one sensing layer, positioned between the first electromagnetic shielding layer and the second electromagnetic shielding layer, comprising an array of touch sensors and multiple traces for connecting the touch sensors to touch sensing circuitry; and at least one electromagnetic shielding wall, extending from the first electromagnetic shielding layer to the second electromagnetic shielding layer, for shielding one or more of the multiple traces from conductive user input objects.

18 Claims, 10 Drawing Sheets

(56) References Cited

U.S. PATENT DOCUMENTS

| | | | |
|---|---|---|---|
| 2009/0021323 A1* | 1/2009 | Lee | H01P 3/003 333/12 |
| 2009/0315440 A1* | 12/2009 | Makino | H01J 11/18 313/1 |
| 2010/0163299 A1* | 7/2010 | Hsu | H05K 1/0253 174/394 |
| 2010/0220071 A1 | 9/2010 | Nishihara et al. | |
| 2010/0265206 A1* | 10/2010 | Chen | G06F 3/0412 345/174 |
| 2011/0227869 A1* | 9/2011 | Lai | G06F 3/046 345/174 |
| 2011/0260949 A1* | 10/2011 | Ahn | H01J 11/12 345/1.3 |
| 2012/0182706 A1* | 7/2012 | Siomkos | H01L 23/552 361/803 |
| 2012/0306824 A1* | 12/2012 | Horie | G06F 3/03545 345/179 |
| 2013/0038553 A1 | 2/2013 | Huang et al. | |
| 2013/0063393 A1* | 3/2013 | Kurishima | B32B 7/02 345/174 |
| 2013/0293508 A1 | 11/2013 | Lin et al. | |
| 2013/0328797 A1* | 12/2013 | Al-Dahle | G06F 3/0416 345/173 |

FOREIGN PATENT DOCUMENTS

| | | |
|---|---|---|
| EP | 0680006 A1 | 11/1995 |
| WO | 2012/066388 A1 | 5/2012 |
| WO | 2013/160151 A1 | 10/2013 |

* cited by examiner

ELECTROMAGNETIC SHIELDING

TECHNOLOGICAL FIELD

Embodiments of the present invention relate to electromagnetic shielding. In particular, they relate to shielding traces in a capacitive touch sensitive display from conductive user input objects.

BACKGROUND

A capacitive touch sensitive display comprises an array of sensors and touch sensing circuitry for sensing input provided by conductive objects (such as a user's finger or a stylus) positioned on (or close to) the display.

BRIEF SUMMARY

According to various, but not necessarily all, embodiments of the invention there is provided an apparatus, comprising: a first electromagnetic shielding layer; a second electromagnetic shielding layer; at least one sensing layer, positioned between the first electromagnetic shielding layer and the second electromagnetic shielding layer, comprising an array of touch sensors and multiple traces for connecting the touch sensors to touch sensing circuitry; and at least one electromagnetic shielding wall, extending from the first electromagnetic shielding layer to the second electromagnetic shielding layer, for shielding one or more of the multiple traces from conductive user input objects.

According to various, but not necessarily all, embodiments of the invention there is provided a method, comprising: forming a first electromagnetic shielding layer, a second electromagnetic shielding layer and at least one sensing layer, wherein the at least one sensing layer is positioned between the first electromagnetic shielding layer and the second electromagnetic shielding layer and comprises an array of touch sensors and multiple traces for connecting the touch sensors to touch sensing circuitry; and forming at least one electromagnetic shielding wall, extending from the first electromagnetic shielding layer to the second electromagnetic shielding layer, for shielding one or more of the multiple traces from conductive user input objects.

BRIEF DESCRIPTION

For a better understanding of various examples that are useful for understanding the detailed description, reference will now be made by way of example only to the accompanying drawings in which.

DETAILED DESCRIPTION

Figure 1:
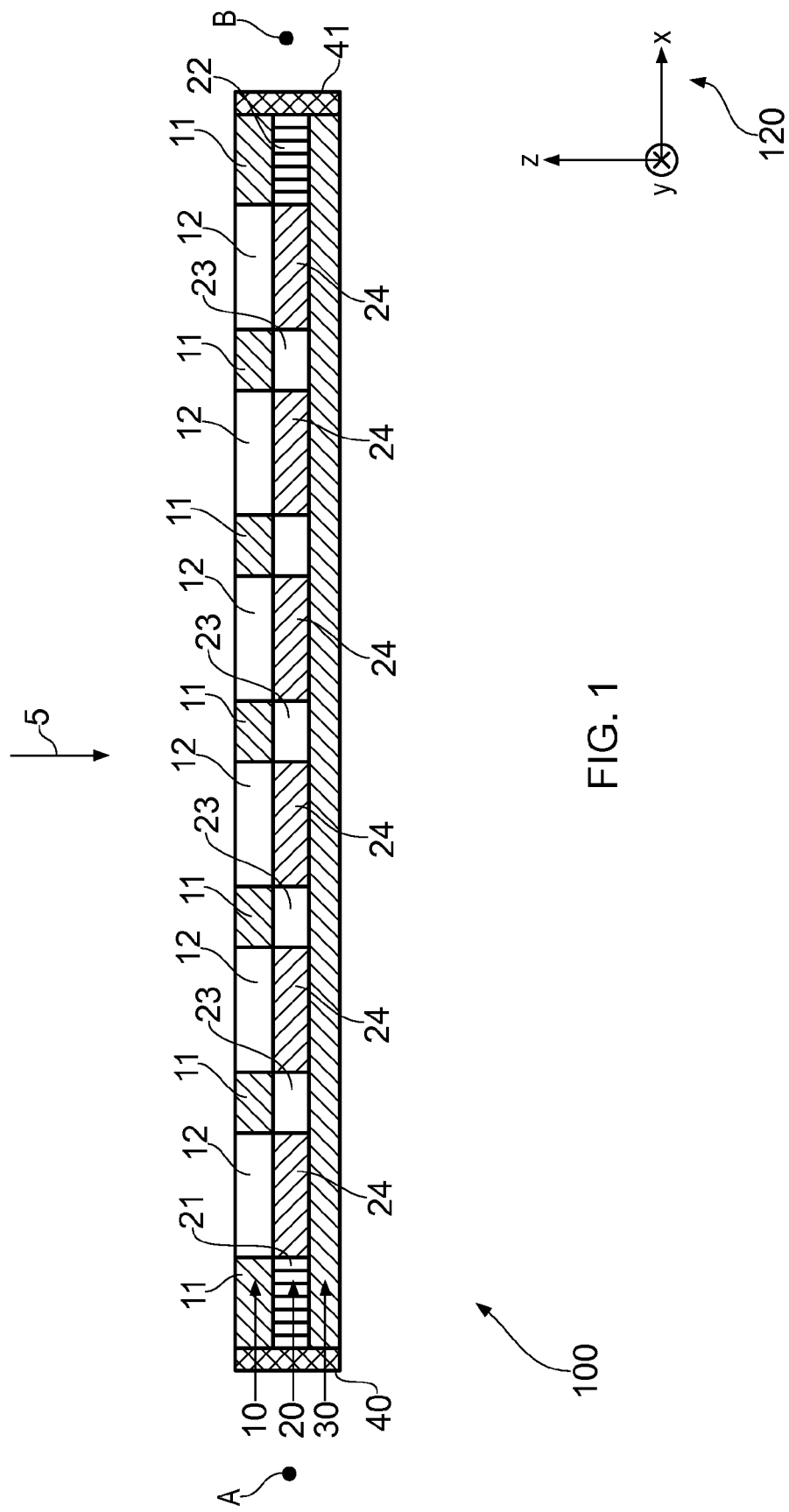
FIG. 1 illustrates a schematic of a cross section of a first example of an apparatus.

Embodiments of the invention relate to shielding traces in a touch sensitive display from conductive objects.

In this regard, the figures illustrate an apparatus 100/101/102/103/104, comprising: a first electromagnetic shielding layer 10; a second electromagnetic shielding layer 30; at least one sensing layer 20, positioned between the first electromagnetic shielding layer 10 and the second electromagnetic shielding layer 30, comprising an array of touch sensors 24 and multiple traces 21-23 for connecting the touch sensors 24 to touch sensing circuitry 4; and at least one electromagnetic shielding wall 40-43, extending from the first electromagnetic shielding layer 10 to the second electromagnetic shielding layer 30, for shielding one or more of the multiple traces 21-23 from conductive user input objects.

FIG. 1 illustrates a cross section of a first example 100 of an apparatus. The illustrated apparatus 100 may, for example, form part of a touch sensitive display. The touch sensitive display might be a capacitive touch sensitive display.

Cartesian coordinate axes 120 have been included in FIG. 1 and a number of the other figures to assist the reader in orientating one figure relative to another. In FIG. 1, the x-axis and the z-axis are perpendicular to one another and are parallel to the plane of the page. The y-axis is perpendicular to both the x-axis and the z-axis and is directed into the page.

The apparatus 100 illustrated in FIG. 1 comprises three layers 10, 20, 30: the uppermost layer 10 is a first electromagnetic shielding layer. The lowermost layer 30 is a second electromagnetic shielding layer 20. The layer 20 sandwiched between the first and second electromagnetic shielding layers 10, 30 is a sensing layer 20. In the illustrated example, each of the first electromagnetic shielding layer 10, the sensing layer 20 and the second electromagnetic shielding layer 30 may be substantially planar. In other examples, at least a portion of these layers 30 is substantially planar.

The apparatus 100 may comprise touch sensing circuitry. The touch sensing circuitry may, for example, comprise (or consist of) a touch sensor processor/controller. The sensing layer 20 comprises an array of touch sensors/pads 24 and multiple conductive traces 21-23 for connecting the touch sensors 24 to the touch sensing circuitry. The touch sensors 24 are electrodes. The touch sensors 24 may, for example, be arranged in columns and rows in a grid.

A trace may be provided for every sensor in the sensing layer 20. That is, a single trace may be provided for each sensor, individually connecting the sensors to the touch sensing circuitry. Some of the traces may be routed through the array of touch sensors. FIG. 1 schematically illustrates blocks which comprise traces 23 positioned between the sensors 24. FIG. 1 illustrates traces 23 between each pair of adjacent sensors, but this need not necessarily be the case. Also, those skilled in the art will realize that, in practice, traces 23 running between adjacent sensors 24 will be spaced from those sensors 24, but this is not shown in FIG. 1 for clarity reasons. Other traces 21, 22 may be routed around the outside of the array of touch sensors, as shown schematically in FIG. 1. This is described in further detail below.

The sensors 24 and the traces 23 in the sensing layer 20 may, for example, be formed from one or more conductive materials. The material may be inherently transparent or inherently non-transparent but substantially invisible to a user due to the nature/size of the sensors 24 and traces 23. Materials such as indium tin oxide (ITO), silver nanowire or carbon nanowire may be used.

The touch sensors 24 in the sensing layer 12 are for sensing touch input from one or more conductive input objects (such as a user digit and/or a stylus) in conjunction with the touch sensing circuitry. Touch input may be sensed when, for example, one or more conductive user input objects are moved towards the apparatus 100 in the direction illustrated by the arrow labelled with the reference numeral 5 in FIG. 1, and positioned close to one or more of the sensors 24 in the sensing layer 20.

In the schematic illustrated in FIG. 1, the width of each of the first electromagnetic shielding layer 10, the sensing layer 20 and the second electromagnetic shielding layer 30 is aligned with the x-axis. The length of each of the first electromagnetic shielding layer 10, the sensing layer 20 and the second electromagnetic shielding layer 30 is aligned with the y-axis. The depth of each of the first electromagnetic shielding layer 10, the sensing layer 20 and the second electromagnetic shielding layer 30 is aligned with the z-axis.

The length of the sensing layer 20 is the same or greater than the width of the sensing layer 20. The depth of the sensing layer 20 is (much) smaller than both the length and the width of the sensing layer 20.

The length of the first electromagnetic shielding layer 10 is the same or greater than the width of the first electromagnetic shielding layer 10. The depth of the first electromagnetic shielding layer 10 is (much) smaller than both the length and the width of the first electromagnetic shielding layer 10.

The first electromagnetic shielding layer 10 includes patterning 11, formed of a substantially transparent, conductive material which electromagnetically shields at least some of the traces 21-23 from conductive user input objects. It can be seen from FIG. 1 that the patterning 11 in the first electromagnetic shielding layer 10 overlies the traces 21-23 in the sensor layer 20. Gaps 12 in the patterning 11 exist above the sensors 24 to enable the sensors 24 to sense conductive user input objects.

The patterning 11 in the first electromagnetic shielding layer 10 may, for example, be formed from one or more conductive materials. The materials may be inherently transparent, or inherently non-transparent but substantially invisible to a viewer due to the size/nature of the patterning 11. Materials such as indium tin oxide (ITO), silver nanowire or carbon nanowire may be used.

Shielding the traces 21-23 from conductive user input objects is advantageous because it prevents/mitigates capacitive coupling between the traces 21-23 and a conductive (user input) object positioned nearby to the traces 21-23, which may create noise in signals that are carried by the traces 21-23 and sensed by the touch sensing circuitry.

The second electromagnetic shielding layer 30 is configured to electromagnetically shield the sensors 24 and the traces 21-23 in the sensing layer 12 from electromagnetic noise emanating from a display panel (or from other electronics in a device, such as a mobile telephone or a tablet computer, in which the apparatus 100 is integrated). The second electromagnetic shielding layer 30 also provides an electrical reference level for the apparatus 100.

The second electromagnetic shielding layer 30 may be a continuous sheet of substantially transparent, conductive material. It may, for example, be formed from indium tin oxide (ITO).

The length of the second electromagnetic shielding layer 30 is the same or greater than the width of the second electromagnetic shielding layer 30. The depth of the second electromagnetic shielding layer 30 is (much) smaller than both the length and the width of the second electromagnetic shielding layer 30.

The apparatus 100 further comprises at least one electromagnetic shielding wall 40, 41, extending from the first electromagnetic shielding layer 10 to the second electromagnetic shielding layer 30, for shielding one or more traces 21, 22 from conductive user input objects.

Two electromagnetic shielding walls 40, 41 can be seen in FIG. 1. The walls 40, 41 are separated from one another by the width of the first electromagnetic shielding layer 10, the sensing layer 20 and the second electromagnetic shielding layer 30. A first wall 40 shields one or more traces 21 from conductive user input objects that are positioned on one side of the apparatus 100, for example in the position marked 'A' in FIG. 1'. A second wall 41 shields one or more other traces 22 from conductive user input objects that are positioned on other side of the apparatus 100, for example in the position marked 'B' in FIG. 1.

Each of electromagnetic shielding walls 40, 41 electrically connects to the both first and second electromagnetic shielding layers 10, 30 forming, in effect, a Faraday cage.

Each illustrated wall 40, 41 extends in the −z direction from the first electromagnetic shielding layer 10, beyond the sensing layer 20, and to the second electromagnetic shielding layer 30. Each illustrated wall 40, 41 extends from the first electromagnetic shielding layer 10 in a direction that is substantially perpendicular to the first and second electromagnetic shielding layers 10, 30.

Each electromagnetic shielding wall 40, 41 may be rigid. For example, each wall 40, 41 may be formed from a conductive paint or glue or like. In addition to this, the electromagnetic shielding walls 40, 41 may be opaque and/or non-reflective to prevent them from being seen by a viewer. The electromagnetic shielding walls 40, 41 may at least partially bind the first electromagnetic shielding wall 10, the sensing layer 20, and the second electromagnetic shielding layer 30 together. The electromagnetic shielding walls 40, 41 could be formed, for instance, from a metal.

Figure 2:
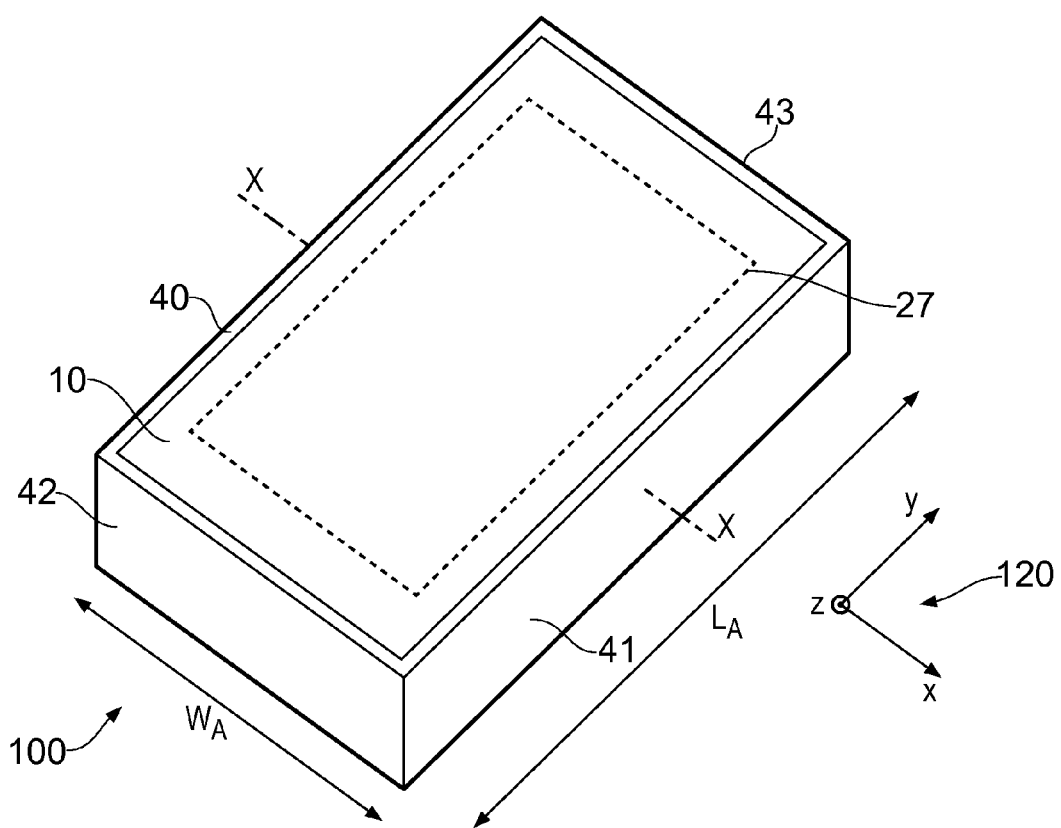
FIG. 2 illustrates a perspective view of the apparatus illustrated in FIG. 1.
Figure 3:
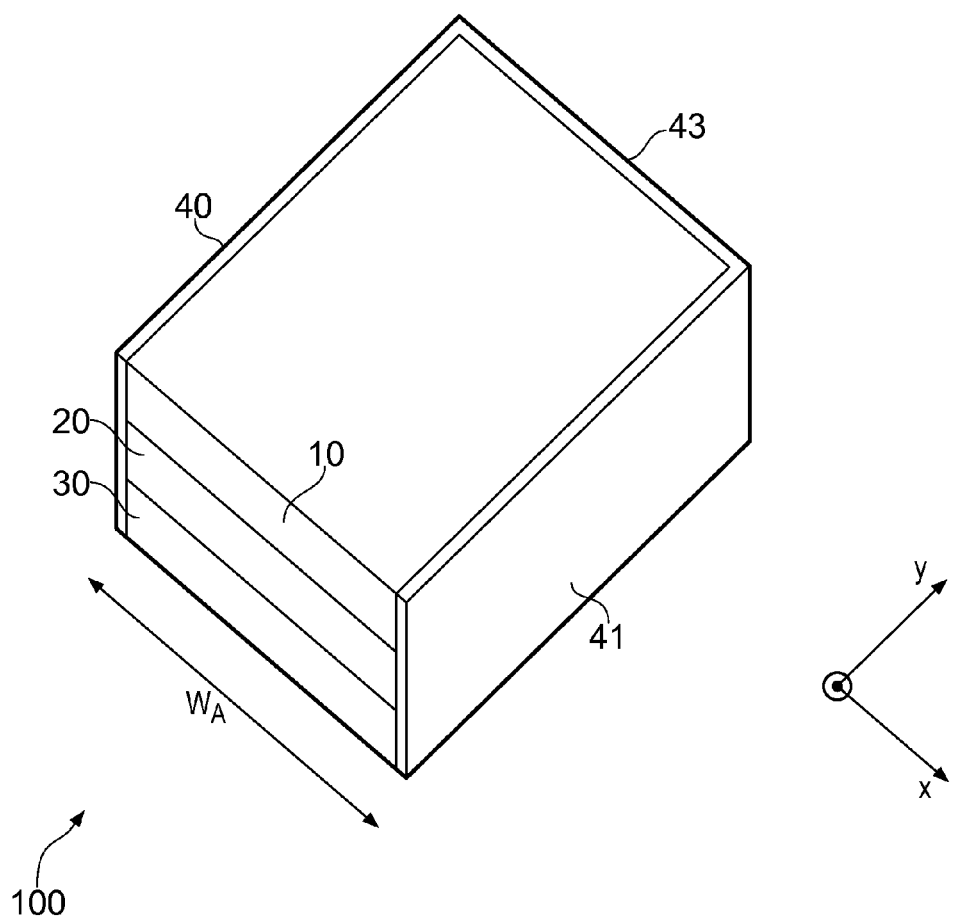
FIG. 3 illustrates a perspective view of the apparatus showing a vertical cross section taken through the line X-X illustrated in FIG. 2.

FIG. 2 illustrates a perspective view of the apparatus 100 illustrated in FIG. 1. The x-axis and the y-axis are parallel to the plane of the page in FIG. 2 and the z-axis is directed out of the page. The width WA and the length LA of the apparatus 100 are marked on the figure. FIG. 3 illustrates a perspective view of the apparatus 100 showing a vertical cross section taken through the line X-X illustrated in FIG. 2.

It can be seen from FIG. 2 that the apparatus 100 further comprises third and fourth electromagnetic shielding walls 42, 43. In other examples, the third and fourth electromagnetic shielding walls 42, 43 may not be present. In this example, each of the third and fourth electromagnetic shielding walls 42, 43 is perpendicular to the first and second electromagnetic shielding walls 40, 41 and connects them together (electrically and mechanically).

The length of the first and second electromagnetic shielding walls 40, 41 is aligned with the y-axis and the height/width of those walls 40, 41 is aligned with the z-axis. The depth of the first and second electromagnetic shielding walls 40, 41 is aligned with the x-axis.

The length of the first and second electromagnetic shielding walls 40, 41 is the same or greater than the width/height of those walls 40, 41. The depth of the first and second electromagnetic shielding walls 40, 41 is (much) smaller than the length and width/height of those walls 40, 41.

The length of the third and fourth electromagnetic shielding walls 42, 43 is aligned with the x-axis and the height/width of those walls 40, 41 is aligned with the z-axis. The depth of the third and fourth electromagnetic shielding walls 42, 43 is aligned with the y-axis.

The first, second, third and fourth electromagnetic shielding walls 40-43 extend around a perimeter defined by the first electromagnetic shielding layer 10, the sensing layer 20 and the second electromagnetic shielding layer 30 in an x-y plane.

A box is defined by a dotted line 27 in FIG. 2. This box identifies a surface area which overlies the "active area" of an electronic display panel. The "active area" of a display panel is the area that comprises an array of electronically controllable pixels of the display panel.

Figure 4:
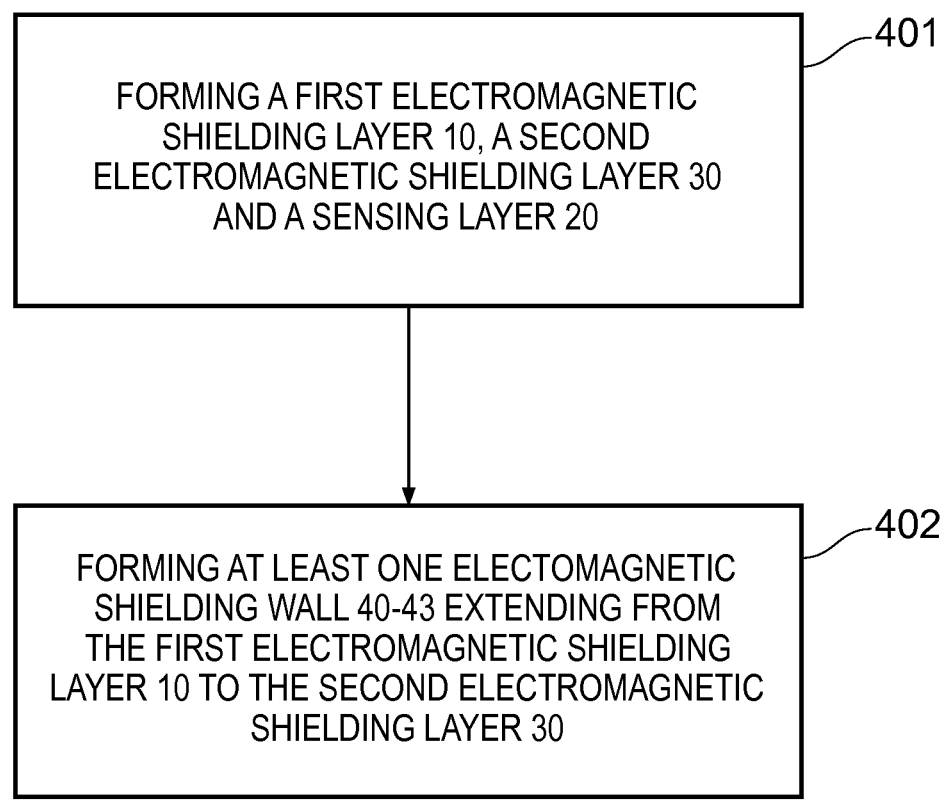
FIG. 4 illustrates a flow chart of a method.

FIG. 4 illustrates a method of manufacturing the apparatus 100 illustrated in FIGS. 1 to 3. At block 401 of FIG. 4, the first electromagnetic shielding layer 10, the second electromagnetic shielding layer 30 and the sensing layer 20 are formed. These layers 10, 20, 30 may be formed in any order. At block 402 in FIG. 4, one or more electromagnetic shielding walls 40-43 are formed which extend from the first electromagnetic shielding layer 10 to the second electromagnetic shielding layer 30, as discussed above.

Figure 5:
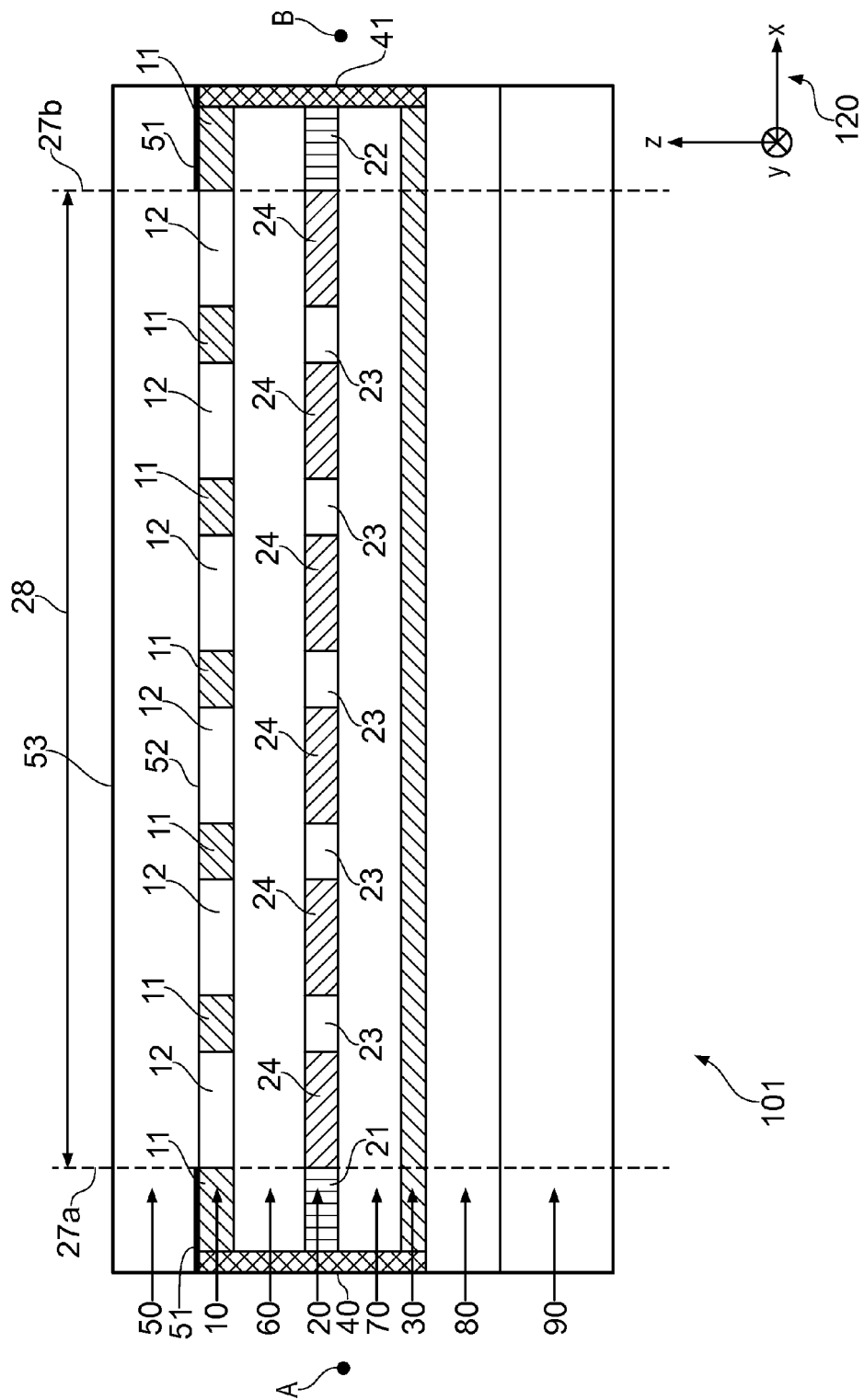
FIG. 5 illustrates a schematic of a cross section of a second example of the apparatus.

FIG. 5 illustrates a second example 101 of the apparatus. The second example 101 differs from the first example 100 in that it further comprises a display window 50, a first substrate 60, a second substrate 70, a third substrate 80 and a display assembly 90.

In the apparatus 101 illustrated in FIG. 5, the first electromagnetic shielding layer 10, including the patterning 11, is formed on the first substrate 60. The sensing layer 20, including the sensors 24 and the traces 21-23, is formed on the second substrate 70. The second electromagnetic shielding layer 30, including the second electromagnetic shielding layer 30, is formed on the third substrate 80.

The first, second and third substrates 60, 70, 80 may, for example, be formed from glass or a plastics material such as polyethylene terephthalate (PET) or a cyclic olefin polymer (COP).

The display assembly 90 comprises a display panel and may comprise, among other things, one or more polarizers. The display panel is an electronic display panel comprising an array of electronically controllable pixels. The pixels are arranged in rows and columns. The display panel could be any type of display panel, such as a liquid crystal display (LCD) panel, an organic light emitting diode (OLED) panel or a quantum dot panel.

As mentioned above, the area of the display panel which includes the array of pixels is known as the 'active area'. The 'active area' is indicated by the line labelled with the reference numeral 28 in FIG. 5. The 'active area' is demarcated by dotted lines 27a, 27b in FIG. 5. Some decoration 51 exists below the display window 50 and above the first electromagnetic shielding layer 10 in FIG. 5, outside the active area of the display panel.

The display window 50 is the outermost layer of the apparatus 101 illustrated in FIG. 5. The display window 50, may, for example, be part of a housing of an electronic device such as a mobile telephone or a tablet computer. The display window 50 has an outer surface 53 and an inner surface 52. Conductive user input objects that are placed on or near proximity to the outer surface 53 of the display window 50, within the 'active area' 28, are sensed by the sensors 24 in the sensing layer 20.

Figure 6:
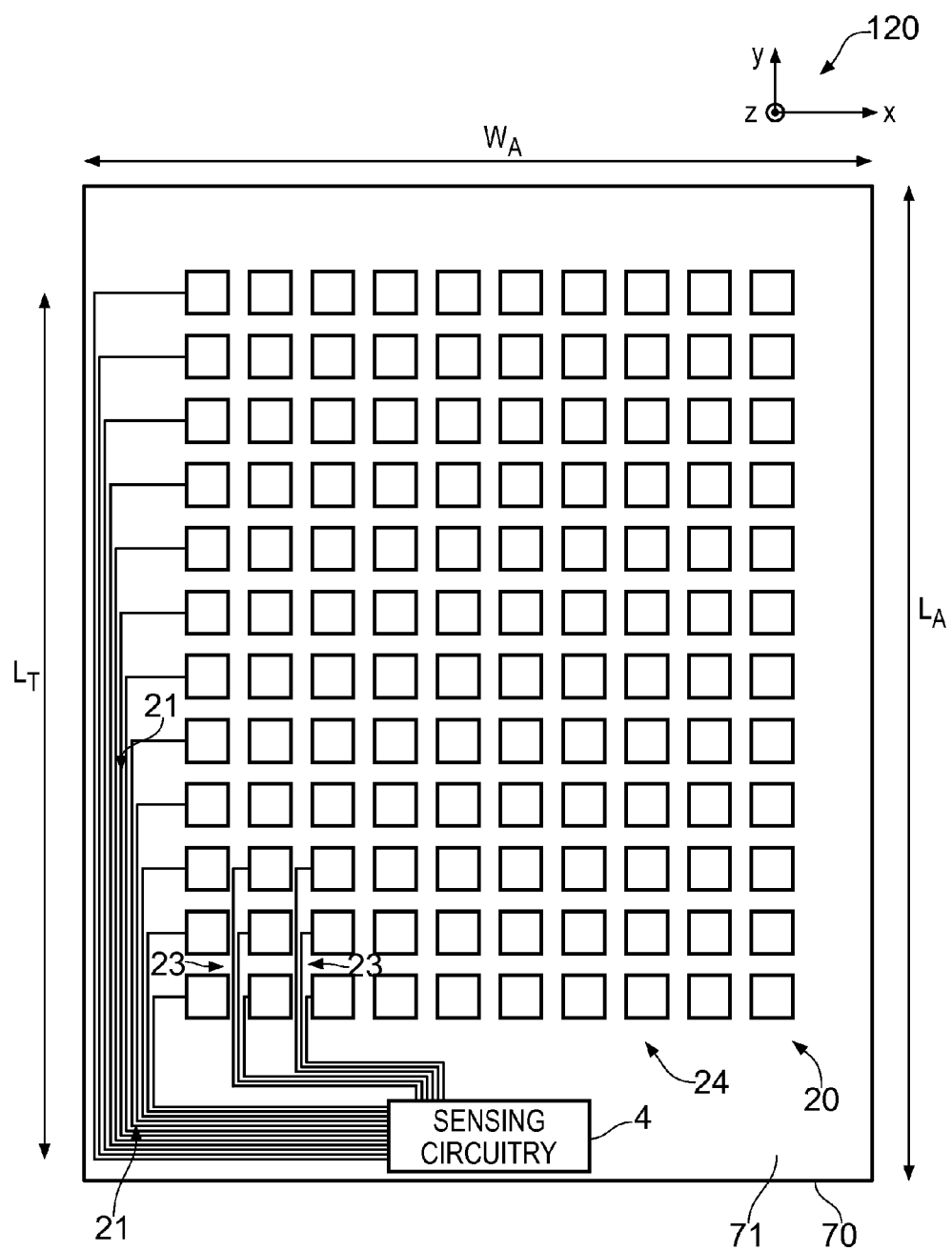
FIG. 6 illustrates a plan view of a sensing layer formed on a substrate, with sensors connected to touch sensing circuitry via traces.

FIG. 6 illustrates a plan view of the sensing layer 20 formed on a surface 71 of the second substrate 70. FIG. 6 shows some of the sensors 24 in the sensing layer 20 connected to touch sensing circuitry 4 by traces 21, 23. As explained above, a single trace may be provided for each sensor, individually connecting the sensors to the touch sensing circuitry 4. However, not all of the traces 21-23 are shown in FIG. 6 for clarity purposes.

It can be seen in FIG. 6 that some traces 21 extend along an edge region of the sensing layer 20 and the second substrate 70. The length of the traces 21 is indicated by the arrow labelled $L_T$. It can also be seen in FIG. 6 that some traces 23 run through the array of touch sensors 24.

Figure 7:
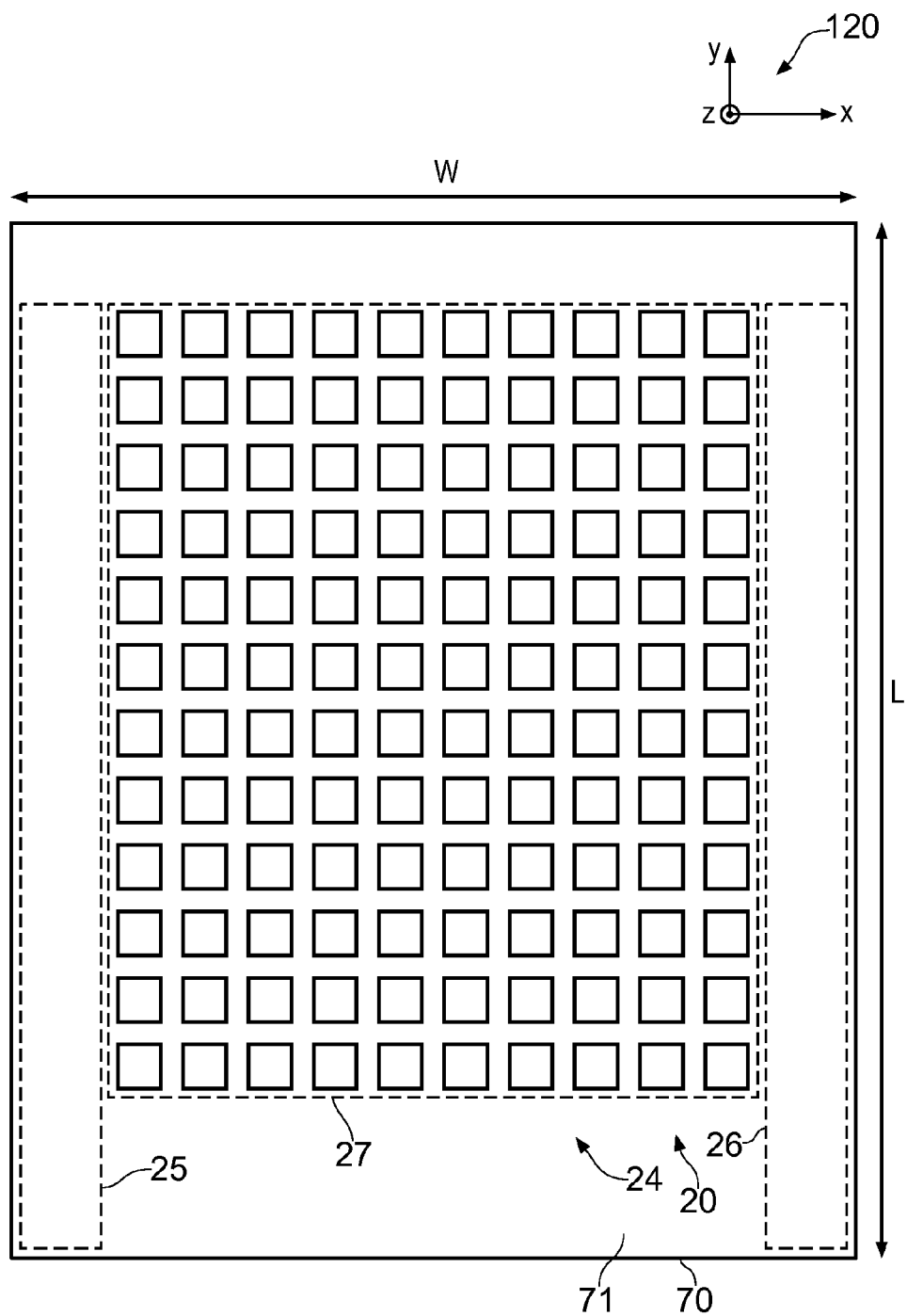
FIG. 7 illustrates a plan view of the sensing layer on the substrate with the traces and the sensing circuitry omitted.

FIG. 7 illustrates the sensing layer 20 and the second substrate 70 without the traces 21, 23 shown. An area demarcating a first edge region is marked with the dotted box labelled with the reference numeral 25 in FIG. 7. Traces 21 that extend along the first edge region 25 are electromagnetically shielded from conductive user input objects by the first electromagnetic shielding wall 40 (such as conductive user input objects positioned at the location labelled 'A' in FIG. 5).

An area demarcating a second edge region is marked with the dotted box labelled with the reference numeral 26 in FIG. 7. Traces 22 that extend along the second edge region 26 are electromagnetically shielded from conductive user input objects by the second electromagnetic shielding wall 41 (such as conductive user input objects positioned at the location labelled 'B' in FIG. 5).

Traces in the other edge regions, located above and below the array of touch sensors in FIGS. 6 and 7 (but not demarcated by dotted boxes), are electromagnetically shielded from conductive user input objects by the third and fourth electromagnetic shielding walls 42, 43.

The array of touch sensors 24 is demarcated by the dotted box labelled with the reference numeral 27 in FIG. 7. This box 27 also indicates the region of the sensing layer 20 that lies above the active area of the display panel in the display assembly 90.

The traces 21, 23 located in the edge regions 25, 26 are located between an edge of the sensing layer 20/second substrate 70 and an extremity of the array of touch sensors 24. The electromagnetic shielding walls 40-43 are for shielding traces 21, 22 that are positioned outside the region occupied by the array of touch sensors 24.

Some (but not all) of the traces 23 that are routed between touch sensors 24 are illustrated in FIG. 6. These traces are electromagnetically shielded from conductive user input objects positioned on the outer surface of the display window 50 by the patterning 11 in the first electromagnetic shielding layer 10.

Figure 8:
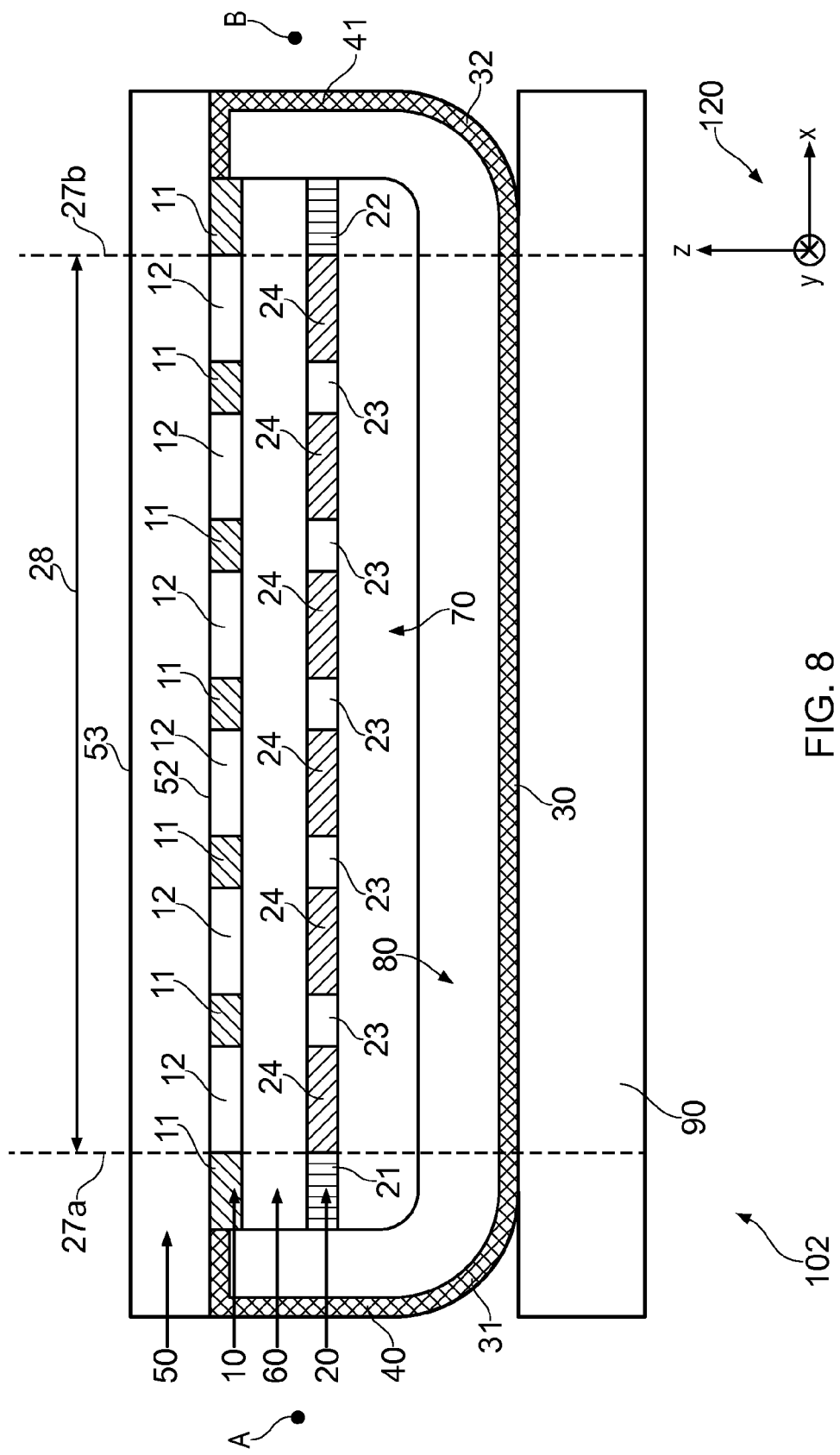
FIG. 8 illustrates a cross section of a third example of the apparatus.

FIG. 8 illustrates a cross section of a third example 102 of the apparatus. The third example differs from the second example 101 in that the second electromagnetic shielding layer 30, and the first and second electromagnetic shielding walls 40, 41 are integrated together in that they are formed from a continuous conductive surface formed on the underside of the third substrate 80. The sides of the third substrate 80 are bent upwardly to form the first and second electromagnetic shielding walls 40, 41 from the continuous conducting surface.

The first electromagnetic shielding wall 40 is connected to the second electromagnetic shielding layer 20 by a first bend 31 in the continuous conductive surface and the second electromagnetic shielding wall 41 is connected to the second electromagnetic shielding layer 20 by a second bend 32 in the continuous conductive surface.

Alternatively, the first and second electromagnetic shielding walls 40, 41 may be integrated with the first electromagnetic shielding layer 30 on an upper surface of the first substrate 60 by bending the sides of the first substrate 60 downwardly.

Figure 9:
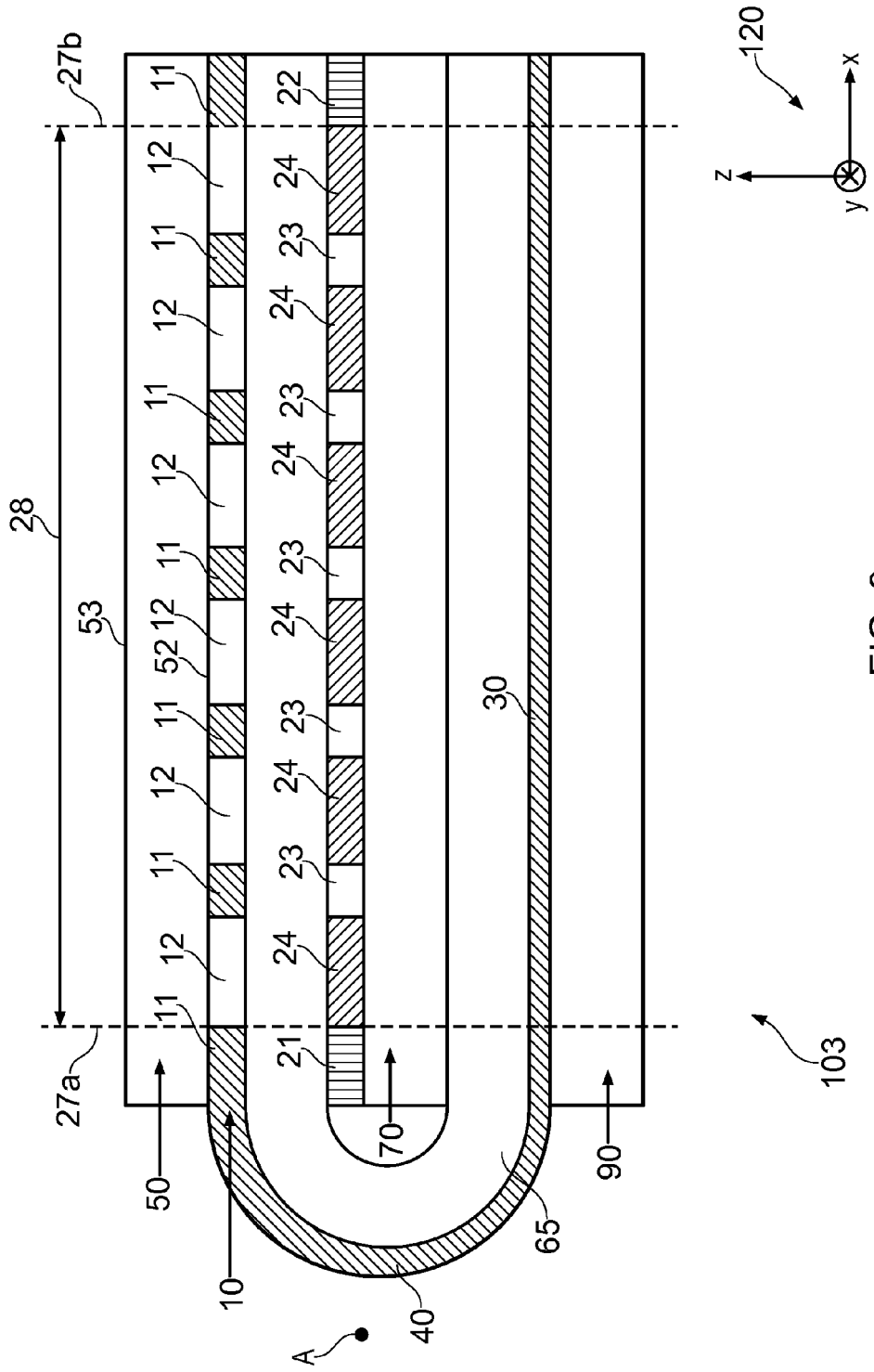
FIG. 9 illustrates a cross section of a fourth example of the apparatus.

FIG. 9 illustrates a cross section of a fourth example 103 of the apparatus. The fourth example 103 differs from the second example 101 in that the first and third substrates 60, 80 have been replaced by a single substrate 65 which is bent at one side of the apparatus 103. The first electromagnetic shielding layer 10, the first electromagnetic shielding wall 40 and the second electromagnetic shielding layer 30 have all been integrated together in that they are all formed from a single conductive surface which is formed on the single substrate 65.

Figure 10:
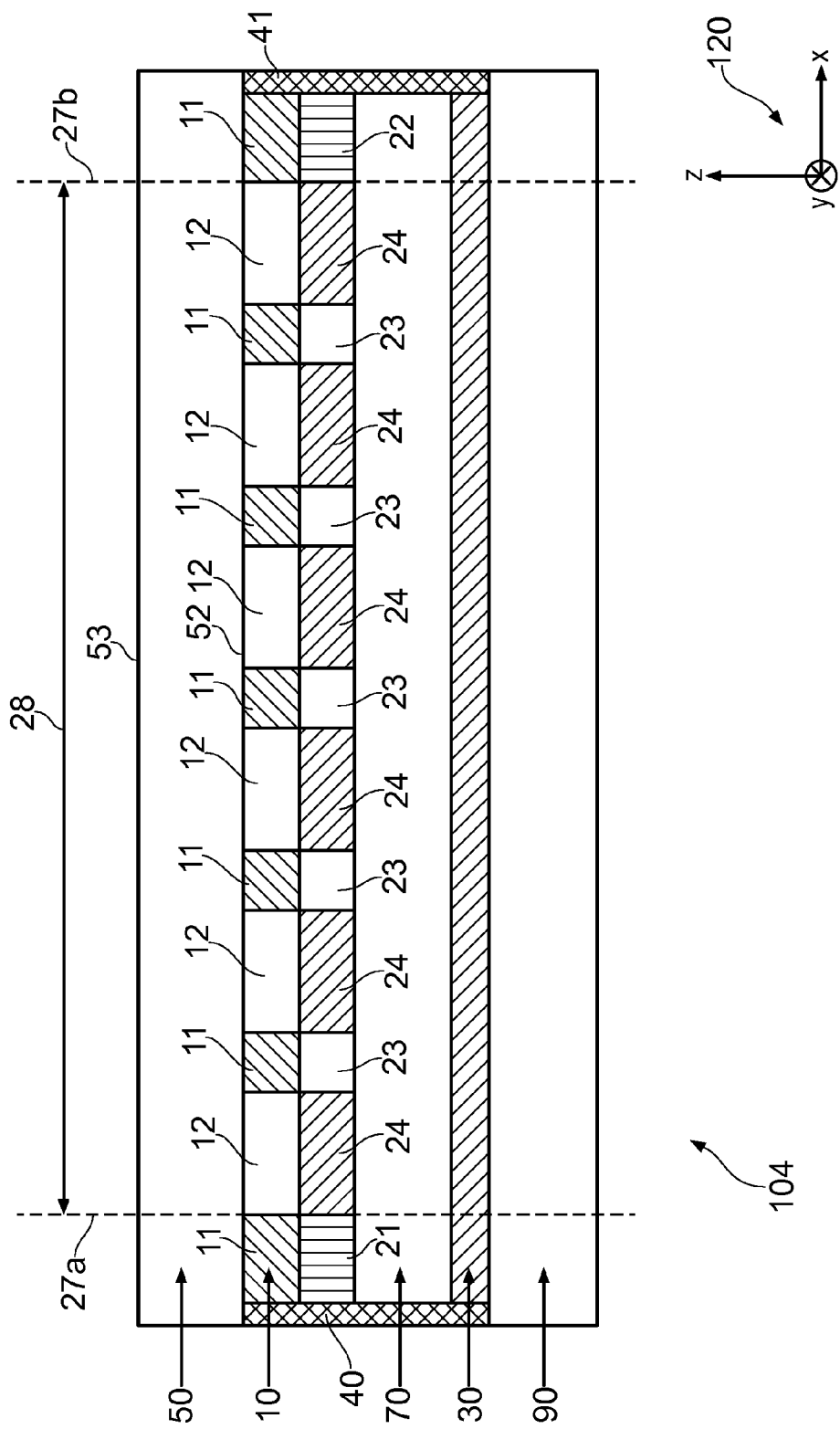
FIG. 10 illustrates a cross section of a fifth example of the apparatus.

FIG. 10 illustrates a cross section of a fifth example 104 of the apparatus. The fifth example 104 of the apparatus differs from the second example 101 of the apparatus in that the first electromagnetic shielding layer 10 is formed on the inner surface 52 of the display window 50 rather than on a separate (first) substrate, and in that the second electromagnetic shielding layer 30 is formed on an upper surface of the display assembly 90 or a lower surface of the second substrate 60 rather than a separate (third) substrate. The first and third substrates 50, 70 from the second example 101 are not present in the fifth example 104, potentially making the fifth example 104 thinner than the second example 101.

In summary, an apparatus 100/101/102/103/104 and a method for electromagnetically shielding traces from conductive user input objects have been described. The apparatus may provide 'full shielding' from the conductive user input objects for the traces using the electromagnetic shielding layers 10, 30 and the electromagnetic shielding walls 40-43 described above. The structure of the electromagnetic shielding layers 10, 30 and the electromagnetic shielding walls 40-43 may enable a relatively compact electronic device (such as a mobile telephone or tablet computer) to be made. For instance, the electronic device may have a smaller border/deadband around the active area 27 of the display.

Furthermore, since the electromagnetic shielding layers 10, 30 and the electromagnetic shielding walls 40-43 are electrically connected, it is possible to maintain the first electromagnetic shielding layer 10 and the second electromagnetic shielding layer 30 at the same electric potential without having separate electrical connections for each of the first electromagnetic shielding layer 10 and the second electromagnetic shielding layer 30.

The electromagnetic shielding walls 40-43 may also prevent/mitigate the ingress of fluid and/or dust into the apparatus 100/101/102/103/104 and provide improved shock protection (for example, in the event that the apparatus 100/101/102/103/104 is dropped).

As used in this application, the term 'circuitry' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

As used in this application, the expression "electrically connected" refers to a direct electrical connection between two elements with no intervening elements therebetween, or an indirect electrical connection between two elements with one or more intervening elements therebetween.

The blocks illustrated in FIG. 4 may represent steps in a method. The illustration of a particular order to the blocks does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed. For example, while a single sensing layer 20 is illustrated in the figures, in other examples, the array of touch sensors may be split across multiple sensing layers.

In some examples, the first electromagnetic shielding layer 10, the sensing layer 20, the second electromagnetic shielding layer 30 and potentially other layers may be laminated together to form a laminated stack. The electromagnetic shielding walls 40-43 may then be formed by injecting/dispensing/painting conductive paint/glue onto the sides of the laminated stack.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the applicant claims protection in respect of any patentable feature or combination of features hereinbefore referred to and/or shown in the drawings whether or not particular emphasis has been placed thereon.

We claim:

1. An apparatus, comprising:
 a first electromagnetic shielding layer;
 a second electromagnetic shielding layer;
 at least one sensing layer, positioned between the first electromagnetic shielding layer and the second electromagnetic shielding layer, comprising an array of touch sensors and multiple traces for connecting the touch sensors to touch sensing circuitry; and at least one electromagnetic shielding wall, extending from the first electromagnetic shielding layer to the second electromagnetic shielding layer, for shielding one or more of the multiple traces from one or more conductive user input objects;

wherein the at least one sensing layer is enclosed by the first electromagnetic shielding layer, the second electromagnetic shielding layer, and the at least one electromagnetic shielding wall; and wherein the first electromagnetic shielding layer is formed from one or more conductive materials that define a patterning having a plurality of gaps, the patterning overlaying and shielding the multiple traces, and the gaps in the patterning being positioned over the touch sensors for sensing the one or more conductive user input objects.

2. The apparatus as claimed in claim 1, wherein the at least one electromagnetic shielding wall extends from the first electromagnetic shielding layer, beyond the at least one sensing layer and to the second electromagnetic shielding layer.

3. The apparatus as claimed in claim 1, wherein at least a portion of the first electromagnetic shielding layer is substantially planar, and the at least one electromagnetic shielding wall extends from the first electromagnetic shielding layer to the second electromagnetic shielding layer in a direction that is substantially perpendicular to substantially planar portion.

4. The apparatus as claimed in claim 1, wherein the at least one electromagnetic shielding wall is for shielding one or more traces extending along an edge region of the at least one sensing layer from conductive user input objects.

5. The apparatus as claimed in claim 1, wherein the at least one electromagnetic shielding wall is for shielding one or more traces, positioned between an extremity of the array of touch sensors and an edge of the at least one sensing layer, from conductive user input objects.

6. The apparatus as claimed in claim 1, further comprising a display panel including an array of pixels, wherein the array of touch sensors is positioned in a region which overlies the array of pixels, and the at least one electromagnetic shielding wall is for shielding one or more traces positioned outside that region.

7. The apparatus as claimed in claim 1, wherein the at least one electromagnetic shielding wall is rigid.

8. The apparatus as claimed in claim 1, wherein the at least one electromagnetic shielding wall comprises a first wall and a second wall spaced from the first wall, and wherein the first and second walls extend from the first electromagnetic shielding layer to the second electromagnetic shielding layer.

9. The apparatus as claimed in claim 1, wherein the at least one electromagnetic shielding wall electrically connects the first electromagnetic shielding layer to the second electromagnetic shielding layer.

10. The apparatus as claimed in claim 1, wherein the at least one electromagnetic shielding wall at least partially binds the first electromagnetic shielding layer, the second electromagnetic shielding layer and the at least one sensing layer together.

11. The apparatus as claimed in claim 1, wherein the at least one electromagnetic shielding wall is integrated with at least one of the first electromagnetic shielding layer and the second electromagnetic shielding layer.

12. The apparatus as claimed in claim 11, wherein the at least one electromagnetic shielding wall and at least one of the first electromagnetic shielding layer and the second electromagnetic shielding layer are formed from a continuous conductive surface and connected by a bend in the continuous conductive surface.

13. The apparatus as claimed in claim 1, wherein the second electromagnetic shielding layer is a continuous sheet of material.

14. A method, comprising:
   forming a first electromagnetic shielding layer, a second electromagnetic shielding layer and at least one sensing layer, wherein the at least one sensing layer is positioned between the first electromagnetic shielding layer and the second electromagnetic shielding layer and comprises an array of touch sensors and multiple traces for connecting the touch sensors to touch sensing circuitry; and
   forming at least one electromagnetic shielding wall, extending from the first electromagnetic shielding layer to the second electromagnetic shielding layer, for shielding one or more of the multiple traces from one or more conductive user input objects;
   wherein the at least one sensing layer is enclosed by the first electromagnetic shielding layer, the second electromagnetic shielding layer, and the at least one electromagnetic shielding wall; and
   wherein the first electromagnetic shielding layer is formed from one or more conductive materials that define a patterning having a plurality of gaps, the patterning overlaying and shielding the multiple traces, and the gaps in the patterning being positioned over the touch sensors for sensing one or more conductive user input objects.

15. The method as claimed in claim 14, wherein the at least one electromagnetic shielding wall extends from the first electromagnetic shielding layer, beyond the at least one sensing layer and to the second electromagnetic shielding layer.

16. The method as claimed in claim 14, wherein at least a portion of the first electromagnetic shielding layer is substantially planar, and the at least one electromagnetic shielding wall extends from the first electromagnetic shielding layer to the second electromagnetic shielding layer in a direction that is substantially perpendicular to substantially planar portion.

17. The method as claimed in claim 14, wherein the at least one electromagnetic shielding wall is for shielding one or more traces extending along an edge region of the at least one sensing layer from conductive user input objects.

18. The method as claimed in claim 14, wherein the at least one electromagnetic shielding wall is for shielding one or more traces, positioned between an extremity of the array of touch sensors and an edge of the at least one sensing layer, from conductive user input objects.

* * * * *